United States Patent [19]

Hemmat et al.

[11] 4,124,698

[45] Nov. 7, 1978

[54] METHOD OF CHEMICALLY SHARPENING MONOCRYSTALLINE RIBBON

[75] Inventors: Naim Hemmat, Mendham, N.J.; Harold E. Labelle, Jr., Hanover; Charles Lamport, Tewksbury, both of Mass.

[73] Assignee: Tyco Laboratories, Inc., Exeter, N.H.

[21] Appl. No.: 768,186

[22] Filed: Feb. 14, 1977

Related U.S. Application Data

[63] Continuation of Ser. No. 553,113, Feb. 26, 1975, abandoned.

[51] Int. Cl.² ............................ C01F 7/02; C23F 1/02
[52] U.S. Cl. .................................. 156/637; 423/625; 156/647; 156/667
[58] Field of Search ............... 156/637, 667, 647, 654; 423/625

[56] References Cited

U.S. PATENT DOCUMENTS

| 2,865,125 | 12/1958 | Longsfeld | 156/7 |
| 2,881,059 | 4/1959 | Spencer | 156/7 |
| 2,915,475 | 12/1959 | Bugosh | 423/625 X |
| 3,042,566 | 7/1962 | Hardy | 156/2 |
| 3,619,309 | 11/1971 | Foktor et al. | 423/625 X |
| 3,630,794 | 12/1971 | Kushmen | 156/2 |
| 3,718,494 | 2/1973 | Jacobson | 423/625 X |
| 3,808,065 | 4/1974 | Robinson et al. | 156/2 |
| 3,878,005 | 4/1975 | Warren et al. | 156/2 |
| 3,912,563 | 10/1975 | Tomioka et al. | 56/637 |

Primary Examiner—Herbert T. Carter
Attorney, Agent, or Firm—Schiller & Pandiscio

[57] ABSTRACT

The invention is a method for sharpening opposed edges of a monocrystalline ribbon. The method consists of suspending a monocrystalline body of a material such as alpha-alumina in the form of a ribbon (or plate) in a body of a selected solvent, and providing relative movement between the ribbon and solvent with the direction of relative movement being generally normal to the plane of the ribbon.

7 Claims, 3 Drawing Figures

METHOD OF CHEMICALLY SHARPENING MONOCRYSTALLINE RIBBON

This application is a continuation of our copending application Ser. No. 553,113 filed Feb. 26, 1975 and now abandoned for Method of Chemically Sharpening Monocrystalline Ribbon.

This invention relates to a method for sharpening edges on crystalline bodies, and more particularly to methods for sharpening opposed edges of a monocrystalline ribbon or plate.

Various methods are known in the art for growing monocrystalline bodies in the form of ribbons or thin plates having a rectangular cross-sectional configuration. For example, rectangular ribbons of alpha-alumina may be formed by the so-called "EFG" process which involves growth on a seed from a liquid film of feed material (e.g. molten alumina) sandwiched between the seed or body growing on the end of the seed and the end surface of a die, with the liquid in the film being continuously replenished from a reservoir of molten feed material contained in a crucible by action of capillary rise in one or more capillaries in the die. The film spreads across the full expanse of the die's end surface to the edge or edges thereof formed by intersection with the side surface or surfaces of the die. The angle of intersection of the aforesaid surfaces of the die is such relative to the contact angle of the film that the liquid's surface tension will prevent it from over-running the edge of the die's end surface. The growing body grows to the shape of the film which conforms to the edge configuration of the die's end surface. A rectangular ribbon may thus be produced by providing a die having a rectangular end surface. Further details of the "EFG" process are described in detail in U.S. Pat. No. 3,591,348, to Harold E. LaBelle, Jr. Ribbons or thin plates also may be made by cutting them from relatively large size boules.

It is desirable to provide high temperature resistant monocrystalline ribbons and plates with sharp edges so that they may be used as cutting instruments. However, attempts to grow monocrystalline ribbons with sharp edges suitable for cutting purposes by the "EFG" process as above-described have not yielded satisfactory results. Furthermore, mechanical sharpening of ribbons of materials such as of alpha-alumina generally have not been successful due to the hardness of such ribbon material and also because of the tendency of the edge to break away as it is being formed.

Accordingly, a primary object of the present invention is to provide a method for sharpening one or more edges of a substantially monocrystalline ribbon or plate.

A more specific object of this invention is to provide a method for sharpening the opposed edges of a substantially monocrystalline ribbon or plate of alpha-alumina.

Still other objects will be obvious from the following detailed specification.

Described briefly, the invention consists of chemically sharpening a ribbon of the character mentioned by suspending the ribbon in a selected solvent, and establishing and maintaining relative movement between the ribbon and the body of solvent with the direction of movement being generally normal to the plane of the ribbon. Material is dissolved from a side of the ribbon at its edges whereby the edges are sharpened. In a preferred embodiment of the invention the relative movement is periodically reversed whereby opposed sides of the ribbon are dissolved away at the side edges.

Other features and many of the attendant advantages of this invention are set forth in or rendered obvious by the following detailed description which is to be considered together with the accompanying drawings wherein.

Figure 1:
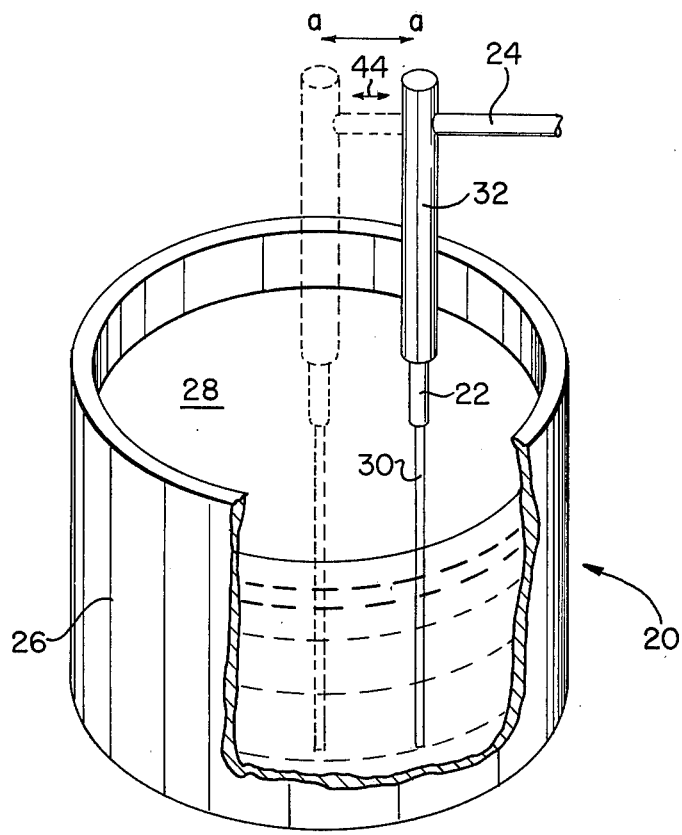
FIG. 1 is a perspective view, partly in action, of one form of apparatus for sharpening monocrystalline ribbons in accordance with the teachings of the present invention.
Figure 2:
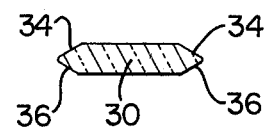
FIG. 2 is an enlarged, cross-sectional view of ribbon sharpened in accordance with the teachings of the present invention.

Referring now to FIGS. 1 and 2 the illustrated apparatus comprises a container or crucible 20, and a holder member 22 adapted for reciprocal movement by a crank arm 24. The crucible comprises a bottom wall (not seen) and a cylindrical side wall 26. The crucible is open at its top end. The crucible is adapted for containing a body of a selected solvent 28 for the monocrystalline ribbon. For example, for a ribbon which comprises substantially monocrystalline alpha-alumina (i.e. sapphire), solvent 28 may comprise a melt of vanadium pentoxide ($V_2O_5$) or potassium tantalate niobate (KTN), in which case the crucible is preferably formed of platinum. Other materials which dissolve or etch alpha-alumina also may be used as the solvent as will be obvious to those skilled in the art.

The holder member 22 is adapted for holding a ribbon 30 of the selected monocrystalline material. For example, holder member 22 may be provided with a pair of gripping surfaces (not shown) adjacent one end for attaching to the ribbon 30. Holder member 22 is attached adjacent its other end to one end of a vertical support member 32 which in turn is mounted adjacent its other end to the crank arm 24. The holder member 22, support member 32 and crank arm 24 are assembled so that the holder member 22 extends vertically downward to just short of the melt in the crucible. The ribbon 30 extends down into the melt, but terminates short of the bottom of the crucible. Completing the apparatus are means (not shown) for reciprocating crank arm 24 along its axis as shown by the double-headed arrow 44, whereby the ribbon is driven back and forth along a straight line through the solvent. With the crank arm and support arranged as above-described the ribbon is suspended vertically in the solvent and is oriented so that its broad sides extend transversely to its path of movement in the solvent.

An important requirement of the present invention is that the ribbon 30 moves in the body of solvent 28 in a direction generally normal to the plane of the ribbon. Also, movement must be controlled so as to maintain substantially laminar flow of solvent past the ribbon at substantially all times during the sharpening process. With regard to this latter requirement, one skilled in the art will recognize that the speed of movement under which laminar flow is achieved will depend on many variables, including the size and shape of the ribbon and of the crucible, and the viscosity of the solvent. The viscosity in turn will vary depending on such variables as temperature. Obviously, some turbulence may be generated within the body of solvent at start-up, and also during the time direction of movement is being reversed; however, turbulance may be kept to a minimum by carefully controlling acceleration and deceleration of the ribbon. Also, the period of time during which the ribbon is moving through the solvent under laminar flow should be substantially in excess of the time required to change direction. By carefully controlling the movement of the ribbon through the solvent as above described, it is possible to achieve sharpening of its two opposed edges on both sides of the ribbon as shown at 34 and 36 in FIG. 2. Moreover, reciprocal movement is not necessary, and sharpening may be achieved by simply moving the ribbon in one direction through a body of solvent with the direction of movement substantially normal to the plane of the ribbon. However, uni-directional movement will result in dissolving away portions of the ribbon along only one side. For this reason it is generally preferred to reciprocate the ribbon in the solvent as above-described.

In the practice of this invention, it is preferred that the ribbon be of the type which has its c-axis disposed parallel to its longitudinal geometric axis since such ribbons exhibit the best edge sharpening when subjected to the method herein described.

Figure 3:
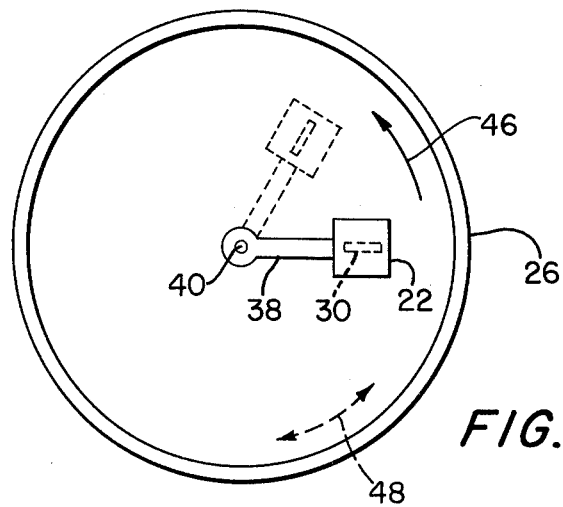
FIG. 3 is a top view of an alternate form of apparatus for sharpening monocrystalline ribbons in accordance with the teachings of the present invention.

FIG. 3 illustrates another form of apparatus for sharpening monocrystalline ribbon in accordance with the teachings of the present invention. In this case holder member 22 is connected directly to a horizontal crank arm 38. Crank arm 38 is similar in construction to crank arm 24 of FIG. 1, except that in the embodiment shown in FIG. 3, the crank arm is mounted for rotation around a vertical axis 40. Thus holder member 22 hangs vertically directly from one end of crank arm 38. It will be noted that with the form of apparatus shown in FIG. 3, the ribbon will be rotated in the body of solvent around a vertical axis, i.e. in the direction shown by solid arrow 46. With this arrangement both edges will be sharpened along one side of the ribbon. Alternatively, crank arm 38 may be adapted to periodically reverse direction, i.e., as in the directions shown by broken arrow 48 whereby both edges of the ribbon are sharpened on both sides of the ribbon.

Another possible way of practicing the invention is to modify the apparatus of FIG. 1 so that crank arm 24 is not reciprocated along its own axis but instead can be reciprocated by rotating it on its own axis. With this arrangement the ribbon is supported by holder 22 so that its broad sides extend transversely on its path of back and forth movement in the solvent, i.e. in an arc about the longitudinal axis of crank arm 24.

The following example illustrates more clearly the manner in which a monocrystalline ribbon may be sharpened according to the present invention. The invention, however, should not be construed as limited to the particular embodiment set forth in the example.

A monocrystalline ribbon of alpha-alumina is sharpened as follows: The apparatus of FIG. 1 is used, in which the crank arm 24 is adapted to be reciprocated back and forth along its longitudinal axis. The ribbon is in the form of an elongate, flat body having a rectangular cross-section and its c-axis parallel to its longitudinal axis. The ribbon is 6 inches long and 0.250 inches wide and has a substantially uniform thickness of about 0.012 inches. The ribbon is suspended vertically from holder member 22 in a solvent bath comprising molten vanadium pentoxide. The vanadium pentoxide solvent is in a platinum crucible in the form of a right cylinder which has a diameter of 6 inches, a height of 8 inches and is open at the top. The solvent is maintained at a temperature of between about 900° and about 950° C. The crank arm 24 is oscillated so as to reciprocate the ribbon through a stroke of about 3–4 inches in the solvent. The ribbon is oriented so that its movement is substantially perpendicular to the plane of the ribbon, i.e. normal to its broad sides. The direction of movement is changed periodically, with the result that the ribbon is moved through about 80 complete cycles per minute. The ribbon is reciprocated through the solvent in the above manner for about 30 minutes, and then removed from the solvent. Examination of the ribbon reveals that the portion which was reciprocated in the body of vanadium pentoxide solvent has increased loss of material on both sides at each edge, as shown in FIG. 2. The finished ribbon is approximately 0.150 inches wide and is about 0.004 inches thick at its widest point. The opposed edges of the ribbon are sharpened to a radius of curvature of about 25A°.

Certain changes obvious to one skilled in the art may be made in the above disclosure without departing from the scope of the invention herein involved. For example, the process of the instant invention may be advantageously used to sharpen other monocrystalline materials such as ruby. Also, instead of moving the ribbon through a body of solvent, the ribbon may be held stationary and the solvent can be flowed past the ribbon, perpendicular to the plane of the ribbon, e.g. as by pumping the solvent in a stream past the ribbon. Still other changes may be obvious to one skilled in the art. Accordingly, it is intended that all matter contained in the above description or shown in the accompanying drawings shall be interpreted in an illustrative and not in a limiting sense.

What is claimed is:

1. A method of sharpening opposed edges on an elongate substantially monocrystalline alumina ribbonlike body comprising suspending said body in a solvent for said alumina, and establishing and maintaining relative movement between said body and said solvent with the direction of relative movement being generally normal to the plane of said body, said movement being controlled so as to substantially avoid turbulence within said solvent, and periodically reversing the direction of said relative movement while maintaining said body suspended in said solvent so as to substantially equally sharpen said opposed edges.

2. A method of claim 1 wherein said body is disposed substantially vertically within said solvent.

3. A method of claim 1 wherein said body comprises monocrystalline alpha-alumina, and said solvent is selected from vanadium pentoxide and potassium tantalate niobate.

4. A method of claim 1 wherein said relative movement is achieved by moving said body through said solvent.

5. A method of claim 1 wherein said relative movement is achieved by flowing said solvent past said body.

6. A method of claim 1 wherein said ribbon is formed so that its c-axis is parallel its longitudinal axis.

7. A method of claim 1 wherein said elongate body comprises an elongate, substantially monocrystalline alumina ribbon, whose C-axis is disposed parallel to its longitudinal geometric axis.

* * * * *